US011942929B2

(12) United States Patent
Dykstra et al.

(10) Patent No.: US 11,942,929 B2
(45) Date of Patent: Mar. 26, 2024

(54) INTEGRATED PCM DRIVER

(71) Applicant: pSemi Corporation, San Diego, CA (US)

(72) Inventors: Jeffrey A. Dykstra, Woodstock, IL (US); Jaroslaw Adamski, Streamwood, IL (US); Edward Nicholas Comfoltey, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/815,193

(22) Filed: Jul. 26, 2022

(65) Prior Publication Data
US 2024/0039527 A1 Feb. 1, 2024

(51) Int. Cl.
*H03K 17/296* (2006.01)
*H03K 17/00* (2006.01)

(52) U.S. Cl.
CPC ........... *H03K 17/296* (2013.01); *H03K 17/00* (2013.01)

(58) Field of Classification Search
CPC ...... H03K 17/00; H03K 17/296; H01L 45/06; H01L 45/1625
USPC .................. 327/363; 257/4, 2; 365/163, 113
See application file for complete search history.

(56) References Cited

U.S. PATENT DOCUMENTS

| | | | | |
|---|---|---|---|---|
| 5,376,832 A | * | 12/1994 | Gariboldi | H03K 17/063 327/306 |
| 10,270,448 B1 | * | 4/2019 | Blutman | H03K 19/018514 |
| 11,653,578 B2 | * | 5/2023 | Gong | G11C 13/004 365/163 |
| 2002/0186058 A1 | * | 12/2002 | Prodanov | H03K 19/09429 327/108 |
| 2014/0266300 A1 | | 9/2014 | Sherwin et al. | |
| 2014/0266389 A1 | * | 9/2014 | Sadwick | H04B 3/54 327/333 |
| 2018/0106686 A1 | * | 4/2018 | Furtner | G01K 7/16 |
| 2019/0165265 A1 | * | 5/2019 | Yen | H01L 45/143 |
| 2020/0058354 A1 | | 2/2020 | Slovin et al. | |
| 2020/0059229 A1 | | 2/2020 | Howard et al. | |

OTHER PUBLICATIONS

International Search Report and Written Opinion issued for International application No. PCT/US2023/027477 filed on Jul. 2023 on behalf of PSEMI Corporation, dated Oct. 20, 2023. 12 pages.

* cited by examiner

*Primary Examiner* — Arnold M Kinkead
(74) *Attorney, Agent, or Firm* — Steinfl + Bruno LLP

(57) ABSTRACT

Methods and devices to control PCM switches are disclosed. The described devices include PCM switch drivers and logic and control circuits, all integrated with the PCM and the associated heater on the same chip. Various architectures for the driver are also presented, including architectures implement feedback mechanism to mitigate variations from process, temperature, and supply voltage.

15 Claims, 11 Drawing Sheets

INTEGRATED PCM DRIVER

TECHNICAL FIELD

The present disclosure is related to phase change material (PCM) switches, more in particular to methods and devices used to integrate the PCM switches and their drivers onto the same chip.

BACKGROUND

Phase change materials can generally be used to fabricate integrated circuit (IC) switches as they can be thermally transitioned between amorphous and crystalline states, showing several orders of magnitude change in resistivity. FIG. 1A shows the block diagram of a prior art PCM switch (100A) consisting of a volume of phase-change material (PCM) (102) and an adjacent heater (101), such as a resistor. The heater (101) produces the thermal power needed for transitioning the phase change material from one of the amorphous or crystalline states to the other.

An alternative arrangement to transition the phase change material is to inject current directly though the material. However such arrangement has been shown to be problematic for RF applications.

Currently, in most applications, PCM switches are programmed and driven using lab equipment. This is a rather bulky solution often offering lower performance and higher cost than desired. A more compact and higher performing solution such as a monolithic commercial switch product employing PCM switches is highly needed. In such a product, the PCM, driver and the associated logic circuitry would be integrated on the same chip. The present invention addresses this need.

SUMMARY

The disclosed methods and devices implement an integrated driver to program (i.e., to switch ON/OFF) a phase change material (PCM) switch. The integrated driver interfaces the input from an application circuit to the PCM switch. The described devices provide the required programming waveforms to the PCM switch to transition the switch between the ON and OFF states.

According to a first aspect of the present disclosure, a PCM driving arrangement for programming a state of a phase change material (PCM) switch is provided, comprising: a PCM switch comprising a heater and a volume of phase-change material coupled to the heater; a driver circuit connected to the heater and configured to provide, to the heater, a first electrical pulse profile or a second electrical pulse profile, depending on a desired state to which the PCM switch is to be programmed; and a logic and control circuit coupled to the driver and configured to program the PCM switch by providing: a first control pulse to the driver when the PCM switch is to be programmed in an ON state in correspondence to the first electrical pulse profile, and a second control pulse to the driver when the PCM switch is to be programmed in an OFF state in correspondence to the second electrical pulse profile, wherein the PCM switch, the driver and the logic and control circuit are integrated on the same chip.

According to a second aspect of the present disclosure, a method of programming a state of a phase change material (PCM) switch is disclosed, the PCM switch comprising a heater and a volume of a PCM, the method comprising: providing a driver circuit; integrating the driver and the PCM switch on the same chip; applying a first control pulse to the driver circuit when the PCM switch is to be programmed in an ON state; and applying a second control pulse to the driver when the PCM switch is to be programmed on an OFF state.

According to a third aspect of the present disclosure, a method of programming a state of a phase change material (PCM) switch stack is disclosed, the PCM switch stack comprising a plurality of PCM switches arranged in a stacked configuration, the method comprising driving the plurality of PCM switches in separate time intervals, one or more PCM switches at a time Further aspects of the disclosure are provided in the description, drawings and claims of the present application.

DESCRIPTION OF THE DRAWINGS

Like reference numbers and designations in the various drawings indicate like elements.

DETAILED DESCRIPTION

Figure 1A:
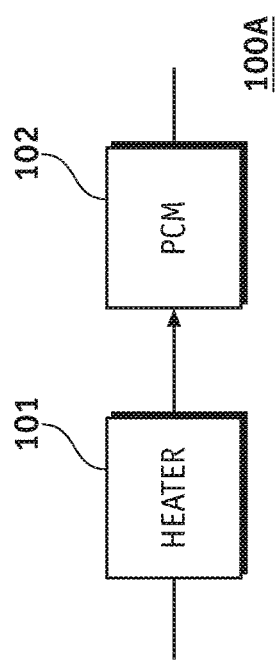
FIG. 1A shows the block diagram of a prior art PCM switch.
Figure 1B:
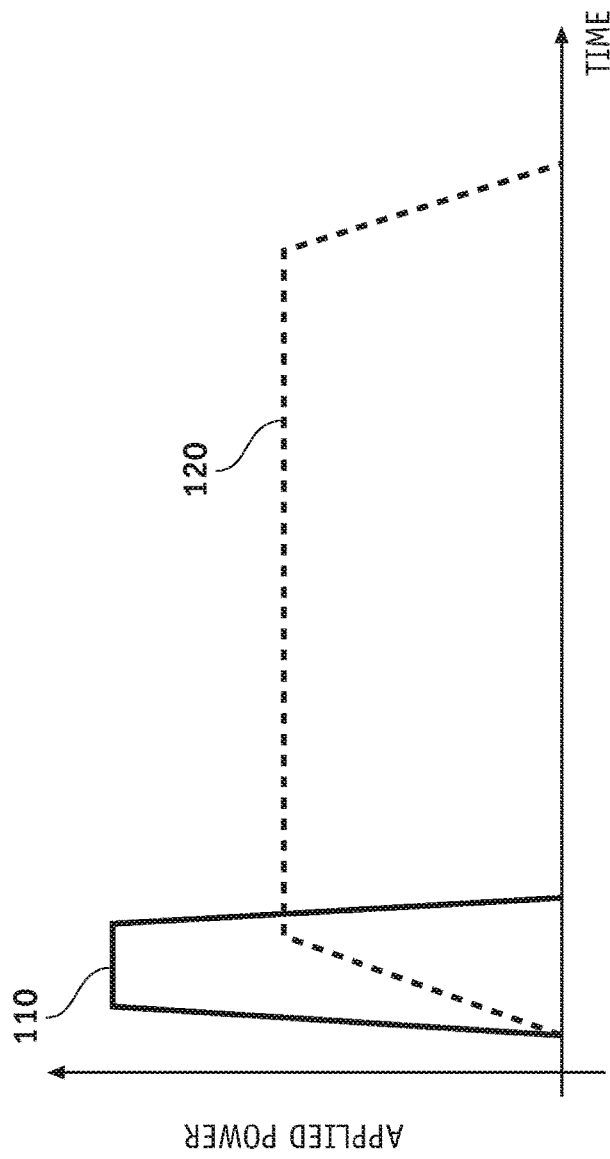
FIG. 1B shows power profiles for driving PCM switch heaters.

FIG. 1B shows two different electrical pulse profiles, in accordance with the present disclosure, for switching the resistivity states of the PCM (102) of FIG. 1A. Such electrical pulse profiles are applied to the heater (101) of FIG. 1A to generate different thermal profiles that result either in amorphizing the PCM (102) of FIG. 1A into a high resistance state (OFF or open) using a higher-power, short-period pulse (110), or crystalizing the PCM (102) into a low resistance state (ON or closed) using a lower-power, long-period pulse (120). Pulses (110, 120) may typically have pulse widths of 100 nsec and 1 usec respectively.

Figure 2:
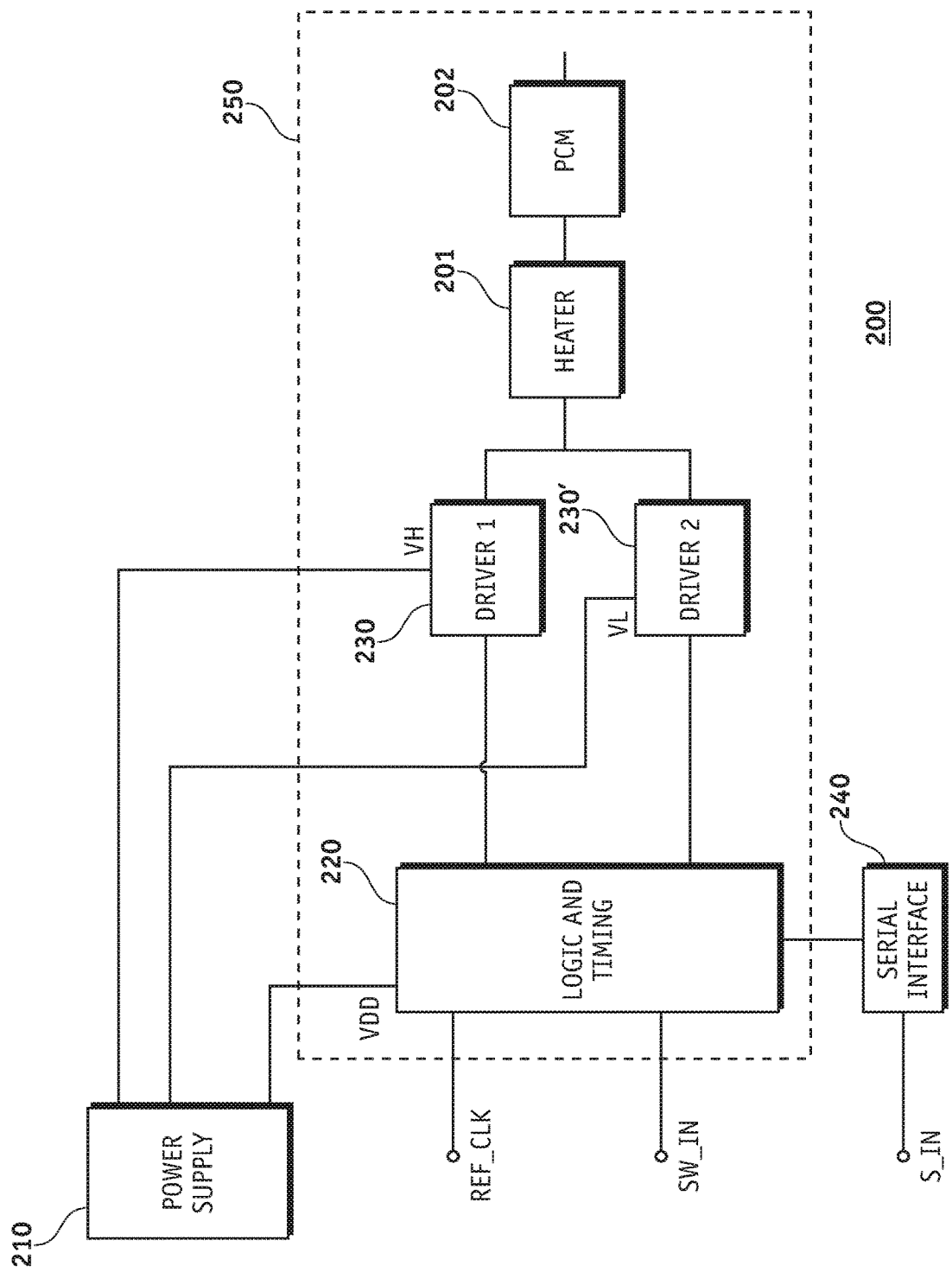
FIG. 2 shows an exemplary driving arrangement for a PCM switch according to an embodiment of the present disclosure.

FIG. 2 shows an exemplary driving arrangement for a PCM switch (200) according to an embodiment of the present disclosure. The driving arrangement comprises a volume of PCM (202) a heater (201), a first driver (230), a second driver (230'), a logic and timing circuit (220), serial interface (240), and power supply module (210). For the purposes of the present disclosure, elements (201) and (202) will be collectively defined as PCM switch. As mentioned previously, different power profiles are implemented to drive a PCM switch. A pulse with a higher power and shorter pulse-width is implemented to put the PCM switch into the OFF state, while a different pulse with a lower power and longer pulse-width is implemented to turn the PCM switch into the ON state. Drivers (230, 230') are used to drive heater (201) to turn PCM switch (201, 202) into the OFF/ON states respectively. As such, a higher bias voltage (VH) is provided to driver (230) by power supply module (210), while a lower bias voltage (VL) is provided to driver (230') by power supply module (210). In an embodiment, a single driver, instead of two, may be implemented to generate the pulse waveforms for both the ON and OFF state of the PCM switch (201, 202). According to the teachings of the present disclosure, the widths of the pulses at the output of drives (230, 230') to drive heater (201) can be programmable. In an embodiment all the constituents of the driving arrangement (200) are integrated on the same chip, as shown by the exemplary dotted box (250).

With further reference to FIG. 2, the logic and timing circuit (220) provides logic level pulses in correspondence with the state of the PCM switch (201, 202). Logic and timing circuit (220) receives digital reference clock input (REF_CLK) and digital control input (SW_IN), which are used to control the ON or OFF state of PCM switch (201, 202). In other words, based on the state of control input (SW_IN) and using digital reference clock input (REF_CLK), power profiles with proper amplitudes and widths in correspondence with the desired state of the PCM (202) are generated and fed to heater (201). As a result, PCM switch (021, 202) is transitioned between the ON and OFF states based on digital control input (SW_IN).

With continued reference to FIG. 2, power supply module (210) provides also the bias voltage (VDD) for logic and timing circuit (220). Switching arrangement (200) further comprises serial interface (240) connected to logic and timing circuit (220). Serial interface (240) includes an input (S_IN) and may be implemented using a serial peripheral interface (SPI) standard, a mobile industry processor interface (MIPI) standard or alike. The input control signal may also come from the serial interface.

Figure 3A:
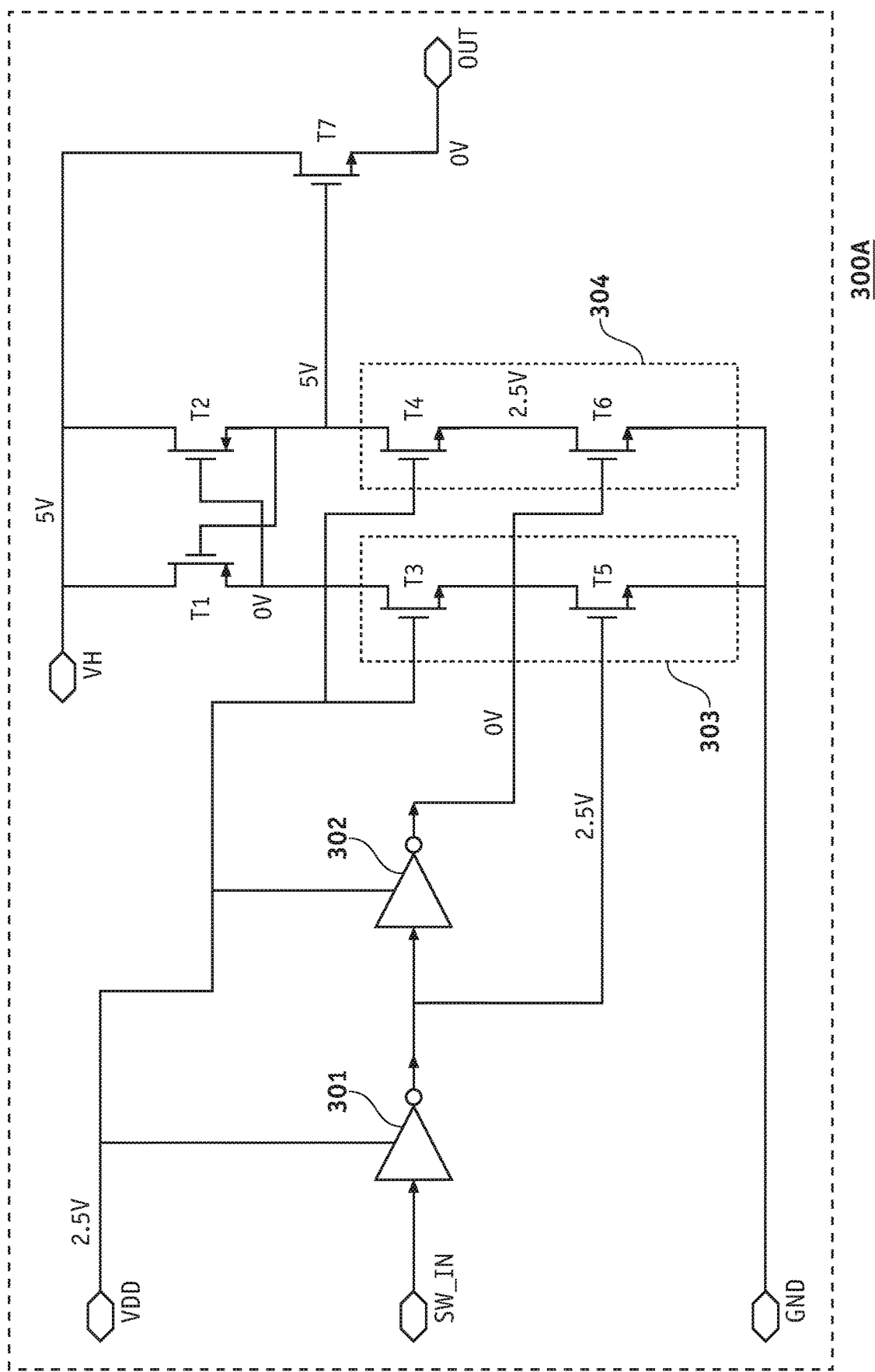
FIG. 3A shows an exemplary PCM switch driver when the driver is in the OFF state according to an embodiment of the present disclosure.

FIG. 3A shows an exemplary PCM switch driver (300A) representing an implementation of any of drivers (230, 230') of FIG. 2 according to an embodiment of the present disclosure. Driver (300A) comprises a first driver switch stack (303) including transistors (T3, T5), and a second driver switch stack (304) including transistors (T4, T6). Driver switch stacks (303, 304) are each arranged in series with corresponding load device transistors (T1, T2), respectively. Also shown, is an output transistor (T7) delivering the voltage and current required by a downstream heater (e.g., heater (201) of FIG. 2) at output terminal (OUT). Driver (300A) further includes a serial arrangement of logic inverters (301, 302) receiving the control input (SW_IN). The logic inverters (301, 302) operate with bias voltage (VDD) and drive transistors (T5, T6) respectively. Bias voltage (VH) is also provided to the driver similarly to what was described with regards to the embodiment of FIG. 2. According to the teachings of the present disclosure, the stacked arrangement shown in the figure allows for improved voltage handling. If desired, the transistor stacking can be increased or reduced according to transistor voltage handling capability and output drive required.

Figure 3B:
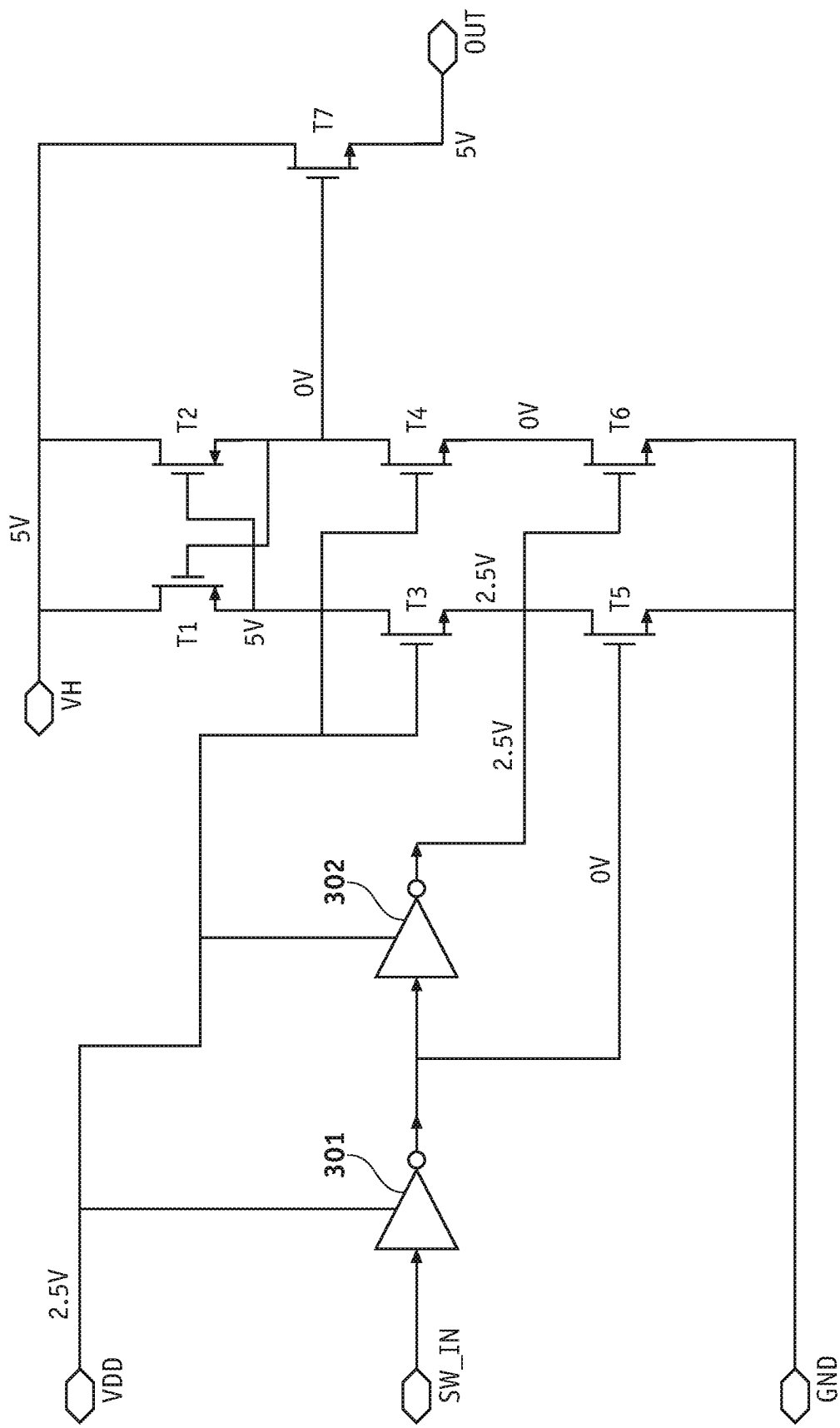
FIG. 3B shows an exemplary PCM switch driver when the driver is in the ON state according to an embodiment of the present disclosure.

The voltage values shown in FIG. 3A represent the case where the PCM switch driver (300A) is in an OFF state. No current is being sent to the heater. Exemplary values for bias voltages (VDD, VH) may be 2.5V, 5V respectively. Voltage levels at various points of the driver (300A) are shown based on such exemplary bias values. On the other hand, FIG. 3B shows the same driver as in FIG. 3A, but this time with voltage values where the PCM switch driver is in the ON state. This is used to transition the PCM material to either the ON or OFF state depending on output amplitude and timing, as previously described.

With reference to FIGS. 3A-3B, transistors (T3, T4, T5, T6 T7) may be NFETs and transistors (T1, T2) may be PFETs. Based on the exemplary bias voltages of (2.5V, 5V) for bias voltages (VDD, VH), the NFETs and PFETs may be each designed to handle a voltage of at least (2.5V, 5V) respectively.

Figure 4:
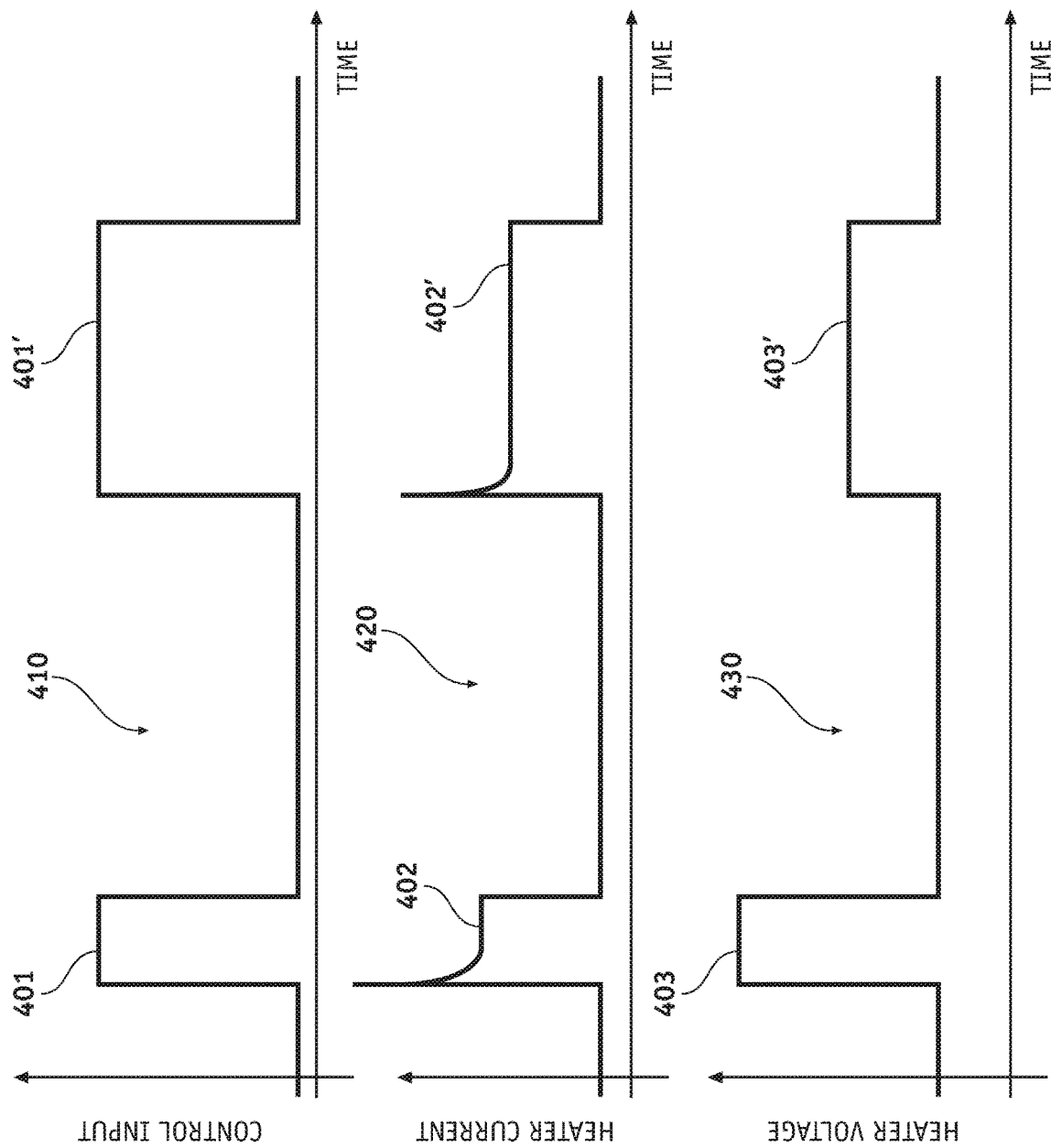
FIG. 4 shows an exemplary timing diagram according to an embodiment of the present disclosure.

FIG. 4 represents exemplary timing diagrams related to the embodiment of FIG. 2. Signals (410, 420, 430) represent control input, heater current, and heater voltage vs. time respectively. Pulses (401, 402, 403) corresponds to the case where the PCM switch is driven or programmed to an OFF state while pulses (401', 402', 403') represent the case where such switch is driven or programmed to an ON state.

Figure 5:
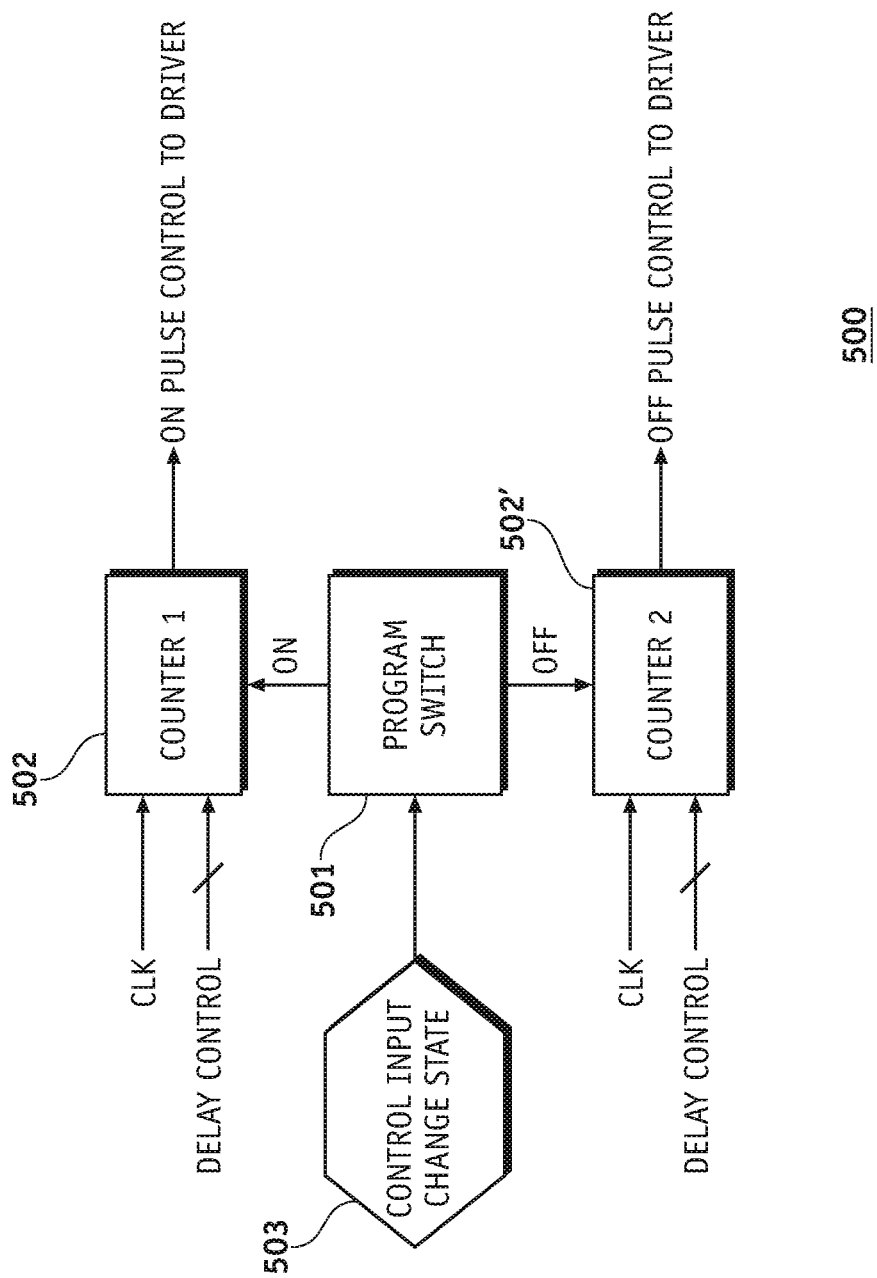
FIG. 5 shows an exemplary state diagram according to an embodiment of the present disclosure.

With reference to FIG. 2, operation of the logic and timing module (220) may be described as a state machine. FIG. 5 shows an exemplary state diagram (500) according to an embodiment of the present disclosure. Referring to both FIG. 2 and FIG. 5, the PCM switch (201, 202) of FIG. 2 may be programmed (501) to be in an ON or OFF state based on the state (503) of digital control input (SW_IN). When the PCM switch (201, 202) is transitioning to the ON state, first counter (502) will generate an ON pulse with a desired width to the driver (230) of FIG. 1, see also FIG. 3A. The desired width may be implemented by counting the number of periods in a reference clock (clk) which is an input to the first counter (502). Similarly, when the PCM switch (201, 202) is transitioning into the OFF state, second counter (502') will generate an OFF pulse with a desired width to the driver (230') of FIG. 1, see also FIG. 3B. Also in this case, the width of the OFF pulse may be achieved by counting the number of clock periods in the reference clock (clk) which is an input to the second counter (502'). The control inputs to the first and second counters may have different values.

As mentioned previously, pulses are needed to be applied to the heater to transition the PCM switch between one state and another. More in particular, higher power profiles need to be implemented when transitioning to the OFF state. This may be problematic when designing PCM switches arranged in a stack configuration for an improved voltage handling. In such stacks, each PCM requires its own separate heater to be programmed and changing the state of all the stacked PCMs at the same time may be taxing on the power supply. This imposes power supply design challenges for the applications using PCM switch stacks.

Figure 6A:
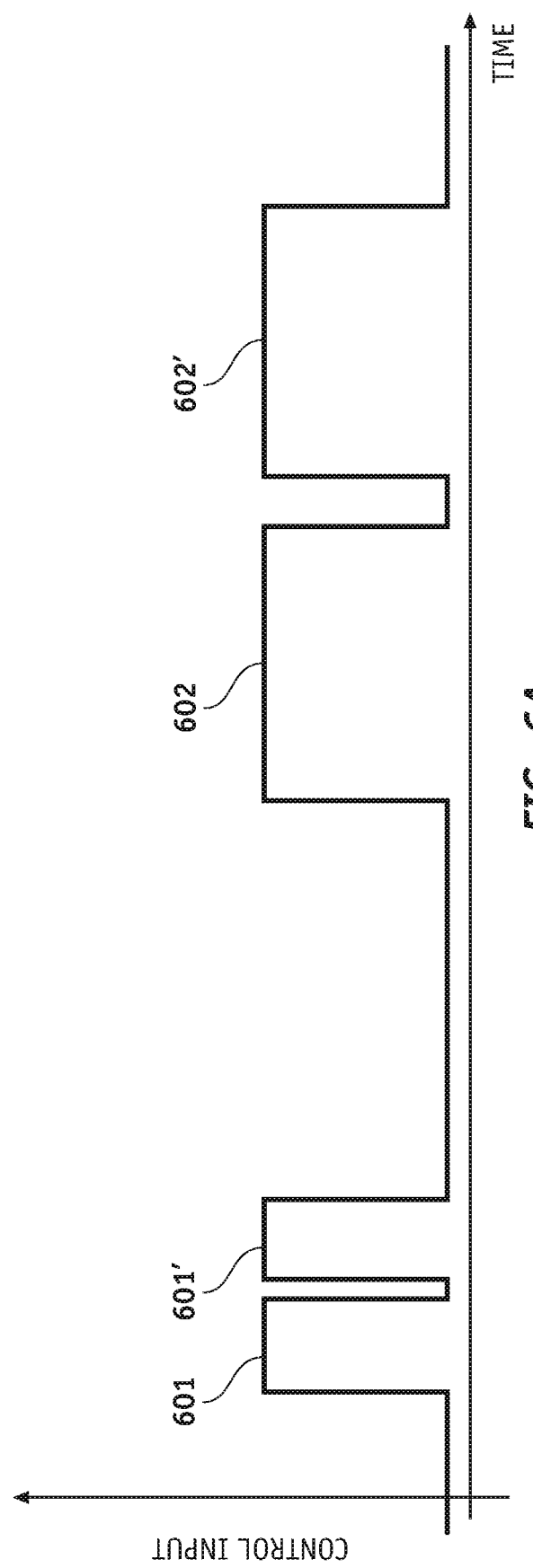
FIG. 6A shows an exemplary timing diagram of staggered control pulses according to an embodiment of the present disclosure.

According to the teachings of the present disclosure, changing the state of the PCM switches within the stack may be performed in a staggered fashion, so that not all the PCM switches are changing state at the same time. As an example, this can be performed one PCM device at a time or several PCM devices at a time. As a result, the peak current drawn from the power supply can be reduced. In order to further clarify this teaching, reference is made to FIG. 6A showing the timing diagram presenting the control input pulses vs. time, when a staggered control of a PCM switch stack is adopted. Control pulses (601, 601') are issued sequentially and they correspond to programming the OFF state of two of the PCM switches within the stack. Similarly, control pulses (602, 602') are issued sequentially and they correspond to programming the ON state of two of the PCM devices within the stack. The timing diagram of FIG. 6A is an example illustrating the staggered control and it is understood that such concept can be extended to control sequentially all of the PCM switches within the stack, one or more at a time, until all the PCM switches within the stack have changed state in accordance with the control input.

The above teachings can be extended to an RF switch with a plurality of inputs and PCM devices and having at least two switch arms to transition OFF or ON. In this embodiment, the control signals may be staggered such that only one PCM device is being programmed at a given instant in time. If the switch arms include stacked PCM devices, each switch stack can be programmed at a given time interval, each PCM switch of the stack being programmed at a given instant.

Figure 6B:
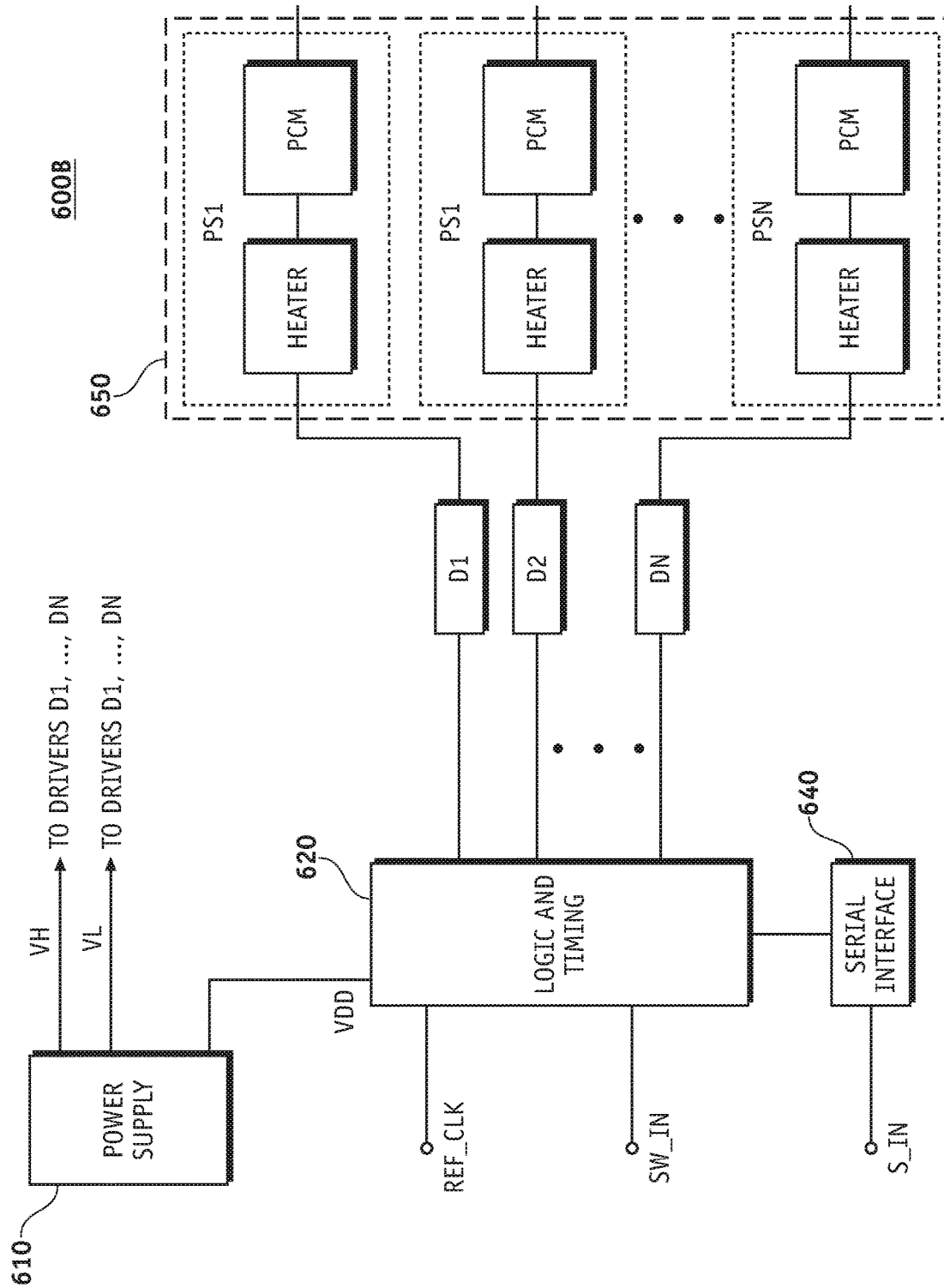
FIG. 6B shows and exemplary driving arrangement of a PCM switch stack according to an embodiment of the present disclosure.

By way of example, FIG. 6B shows an exemplary driving arrangement for a PCM switch stack (600B) representing an exemplary implementation of the above-disclosed teachings related to the embodiment of FIG. 6A. The driving arrangement comprises PCM switch stack (650), drivers (D1, . . . , Dn), control and logic circuit (620), power supply (610), and serial interface (640). PCM switch stack (600B) includes a plurality of PCM switches (PS1, . . . , PSn) arranged in a stacked configuration, wherein in each PCM switch comprises a heater and volume of PCM. Logic and timing circuit (620) provides control input to each of drivers (D1, . . . , Dn) in accordance with the teachings disclosed with regards to the embodiment of FIG. 6A, i.e., in a staggered fashion. As a result, each of the drivers (D1, . . . , Dn) provides driving pulses to a corresponding PCM switch (PS1, . . . , PSn), in correspondence with the state of each power switch (PS1, . . . , PSn). Power supply (610) provides high and low bias voltages (VH, VL) to each driver (D1, . . . , Dn). Bias voltages (VH, VL) correspond to the ON/OFF state of the PCM switches within the PCM switch stack (6500), respectively. With reference to both FIGS. 6A-6B, the states of PCM switches (PS1, . . . , PSn) may be changed, one or more PCM switch at a time, and in separate/staggered time intervals. This means that less instantaneous current is drawn from the power supply to transition switching stack (650) from one state to another, resulting in a simpler power supply design.

Figure 7:
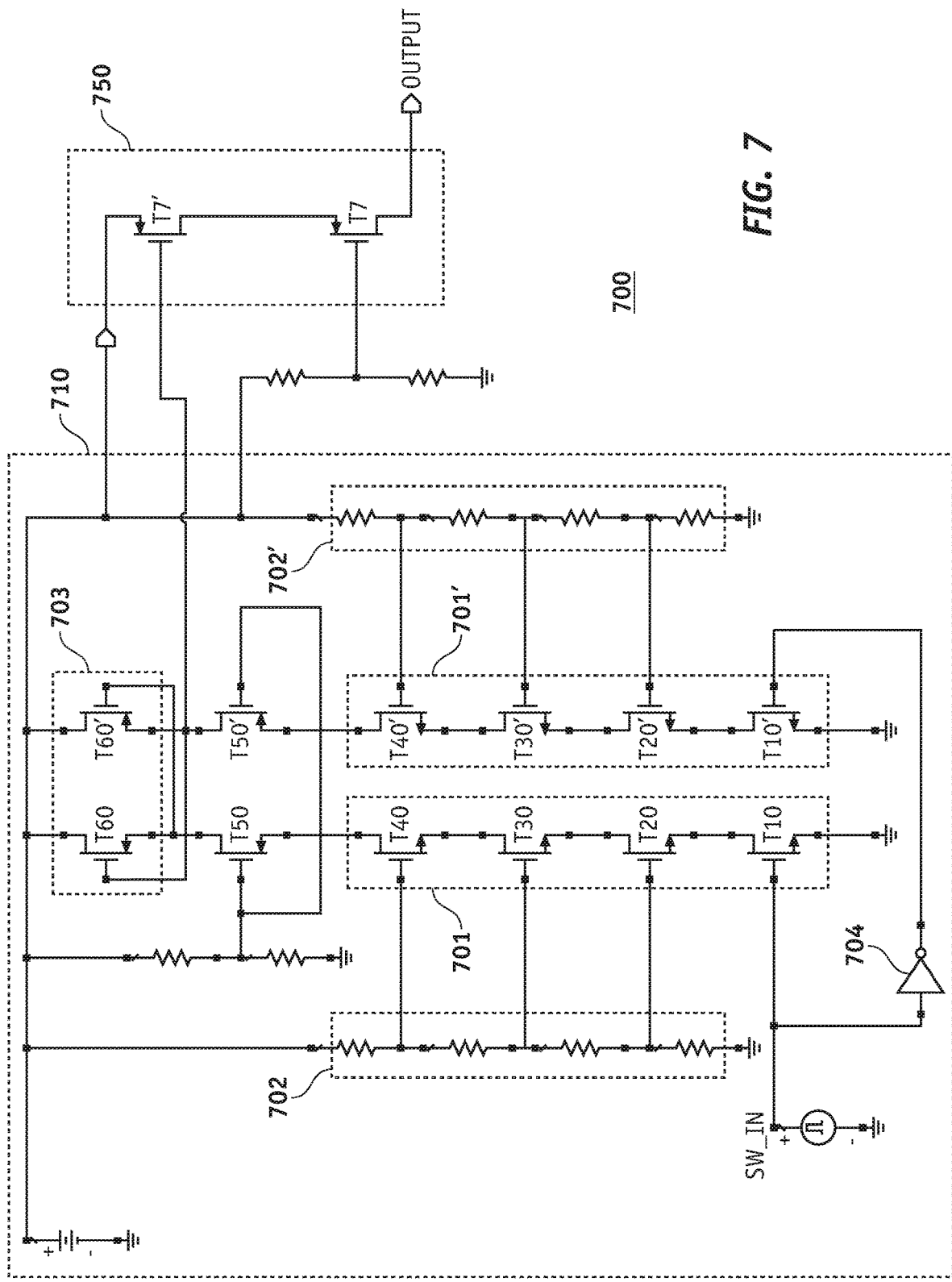
FIG. 7 shows an exemplary PCM switch driver according to an embodiment of the present disclosure.

FIG. 7 shows an exemplary PCM switch driver (700) including a driver first stage (710) and a driver second stage (750) wherein the driver first stage (710) represents an implementation of any of drivers (230, 230') of FIG. 2 according to an embodiment of the present disclosure. Terminal (OUTPUT) provides the input signal to the PCM (not shown). The embodiment of FIG. 7 is similar to the one shown in FIG. 3A, where the teachings of the disclosure are extended in order to handle larger supply voltages and output voltages. The embodiment of FIG. 7 could be beneficial in case of larger heater resistance values or in case a same driver drives a stack of heaters. Driver first stage (710) comprises a first driver switch stack (701) including transistors (T10, . . . , T40), and a second driver switch stack (701') including transistors (T10', . . . , T40'). Driver switch stacks (701,701') are each arranged in series with corresponding transistors (T50, T50'), respectively. Driver first stage (710) further comprises quasi-latch (703) including transistors (T60, T60'). In particular, transistors T60 and T60' are arranged to have positive feedback such that the resulting output signals transition quickly from one state to the other (i.e., driver OFF to ON), and the output voltage swing has the required amplitude to drive the next stage.

Also shown are resistive ladders (702, 702') providing biasing to the gate terminal of the transistors within driver switch stacks (701, 701'), respectively. Control input (SW_IN) is directly applied to transistor (T1) while the inverted version of the control input (SW_IN) is applied to transistor (T10') via inverter (704).

With further reference to FIG. 7, according to an embodiment of the present disclosure, transistors (T10, . . . , T40, T10', . . . , T40') may be NFETs and transistors (T50, T50', T60, T60') may be PFETs. As an example, such embodiment may be implemented using a bias voltage (VH) of 10V, in which case NFETs would have a breakdown voltage handling of 2.5V or better, and PFETs would have a breakdown voltage handling of 5V or better. The output of the circuit is at the drains of transistors (T50, T50'), in order to drive a stack of transistors similar to transistor (T7) shown in FIG. 3A.

Figure 8A:
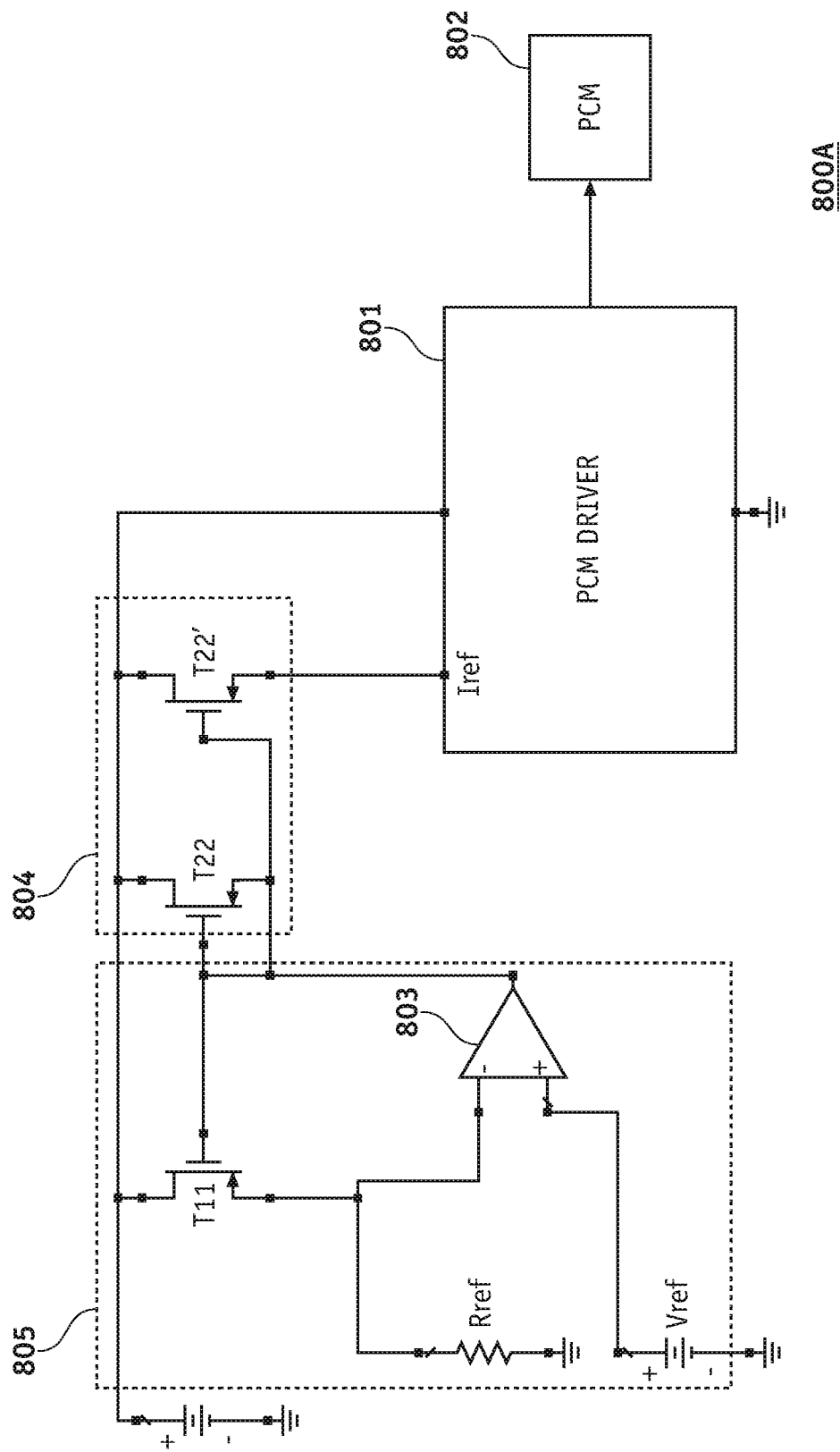
FIG. 8A shows an exemplary PCM switch driver according to an embodiment of the present disclosure.

FIG. 8A shows an exemplary PCM switching arrangement (800A) according to an embodiment of the present disclosure, where a feedback mechanism is provided upstream of the PCM driver. In particular, PCM switching arrangement (800A) comprises PCM driver (801), PCM (802), feedback circuit (805), and transistors (T2, T2') arranged as a current mirror (804). Feedback circuit (805) comprises operational amplifier (OP-amp) (803), reference resistor (Rref), reference voltage (Vref) and transistor (T1). Rref is intended to be identical to the heater resistor to be controlled. Such feedback circuit generates a desired current (Iref) through reference resistor (Rref) due to the voltages at both input terminals of the OP-amp (803) remaining the same at the desired reference voltage (Vref). Current mirror (804) essentially mirrors current (Iref) and feeds such current to PCM driver (801) to ensure the desired voltage and current are generated in the heater in correspondence with the desired state in which PCM (802) should be programmed. By virtue of implementing such feedback mechanism, variations from process, temperature, and supply voltage can be mitigated.

Figure 8B:
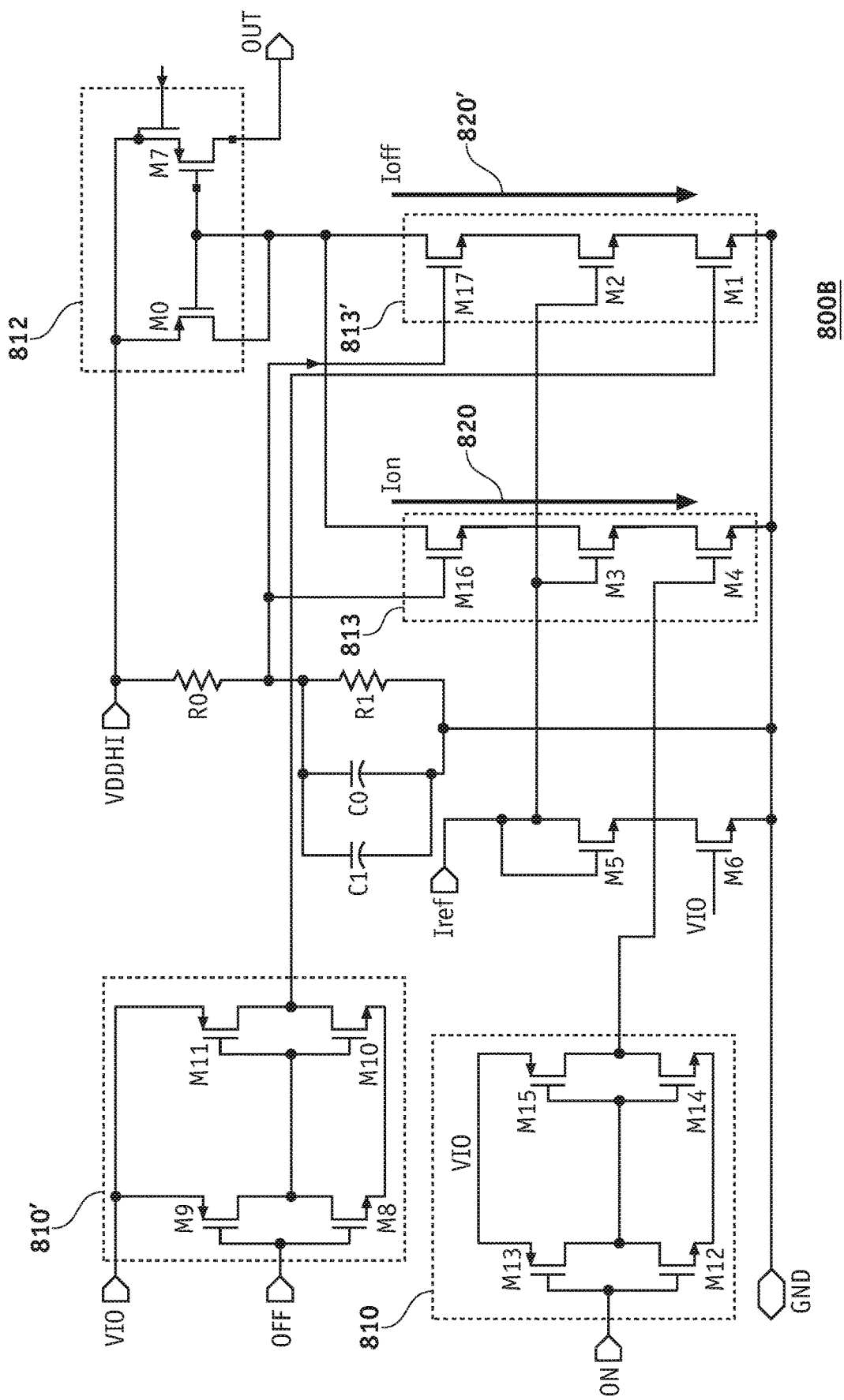
FIG. 8B shows an exemplary PCM switch driver according to an embodiment of the present disclosure.

Implementation of the feedback mechanism of FIG. 8A will imply some design changes to the driver (801) with respect to the architectures shown in FIGS. 3A, 3B and 7. FIG. 8B shows an exemplary PCM driver (800B) according to an embodiment of the present disclosure. PCM driver (800B) represents an exemplary implementation of PCM driver (801) of FIG. 8A and includes switch stacks (813, 813') that are driven by circuits (810, 810') respectively, each provided to program the PCM switch (802) of FIG. 8A. When the PCM switch (802) is to be programmed in the ON state, the output of circuit (810) is HIGH and current Ion flows in switch stack (813), as indicated by arrow (820), while in the case when the PCM switch (802) is to be programmed in the OFF state, the output of circuit (810') is HIGH and current Ioff flows in switch stack (813'), as indicated by arrow (820').

FIG. 8B also shows current Iref as an additional input, in accordance with the teachings of FIG. 8A. Such current is fed to switch stacks (813) and (813') through current mirror (M5, M3) to generate current Ion and current mirror (M5, M2) to generate current Ioff.

Reference current (Iref) is fixed by the feedback circuit. The values of currents Ion and Ioff are generated by the current mirror ratio generated by the ratio of M3 and M2 to M5.

PCM driver (800B) further comprises current mirror (812) that is used to generate the current required by the heater through terminal (OUT), and in correspondence with the ON and OFF states of the PCM switch.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A PCM driving arrangement for programming a state of a phase change material (PCM) switch, comprising:
  a PCM switch comprising a heater and a volume of phase-change material coupled to the heater;
  a driver circuit connected to the heater and configured to provide, to the heater, a first electrical pulse profile or a second electrical pulse profile, depending on a desired state to which the PCM switch is to be programmed; and
  a logic and control circuit coupled to the driver and configured to program the PCM switch by providing:
    a first control pulse to the driver when the PCM switch is to be programmed in an ON state in correspondence to the first electrical pulse profile, and
    a second control pulse to the driver when the PCM switch is to be programmed in an OFF state in correspondence to the second electrical pulse profile,
  wherein
  the driver circuit is configured to drive the heater by providing:
    a first driver pulse in correspondence with the first control pulse, the first driver pulse having a first driver pulse amplitude and a first driver pulse width corresponding to a first time interval, and a second driver pulse in correspondence with the second control pulse, the second driver pulse having a second driver pulse amplitude and a second driver pulse width corresponding to a second time interval, the second driver pulse amplitude is greater than the first driver pulse amplitude, the second driver pulse width is shorter than the first driver pulse width, and the PCM switch, the driver and the logic and control circuit are on the same chip.

2. The PCM driving arrangement of claim 1, wherein the first electrical pulse profile corresponds to a first amount of power generated, through the heater, for the first time interval and the second electrical pulse profile corresponds to a second amount of power generated, through the heater, for the second time interval.

3. The PCM driving arrangement of claim 2, wherein the heater comprises a heater resistor.

4. The PCM driving arrangement of claim 2, wherein:
the first amount of power is a function of the first driver pulse amplitude and the heater resistor; and
the second amount of power is a function of the second driver pulse amplitude and the heater resistor.

5. The PCM driving arrangement of claim 4, wherein the first and the second driver pulse widths are programmable.

6. The PCM driving arrangement of claim 1, wherein the driver circuit comprises a first transistor stack configured to receive the first control pulse, and a second transistor stack configured to receive the second control pulse.

7. The PCM driving arrangement of claim 6, further comprising a first load device transistor disposed in series with the first transistor stack, and a second load device transistor disposed in series with the second transistor stack.

8. The PCM driving arrangement of claim 7, further comprising a first additional transistor disposed in series with the first load device transistor, and a second additional transistor disposed in series with the second load device transistor, the first and the second additional transistors forming a quasi-latch circuit.

9. The PCM driving arrangement of claim 7, further comprising
a feedback circuit configured to generate a set reference current for each of the ON and OFF states of the PCM switch, and
a current mirror coupled to the feedback circuit, the current mirror being configured to input to the driver:
a first reference current in correspondence with the ON state of the PCM switch, or
a second reference current in correspondence with the OFF state of the PCM switch.

10. The PCM switch of claim 1, further comprising a serial interface configured to provide input to the logic and control circuit.

11. The PCM switch of claim 10, wherein the serial interface is implemented according to a serial peripheral interface (SPI) or a mobile industry processor interface (MIPI) standard.

12. A driving arrangement for a phase-change material (PCM) switch stack, comprising:
a plurality of PCM switches, each comprising a heater and a volume of PCM, the PCM switches arranged in a stacked configuration;
a plurality of drivers each configured to drive a corresponding PCM switch of the plurality of PCM switches and provide, to a corresponding heater, a first electrical pulse profile or a second electrical pulse profile, depending on a desired state to which the corresponding PCM switch is to be programmed; and
a logic and control module configured to drive the plurality of drivers in separate time intervals, one or more drivers at a time,
wherein, for each time interval, the logic and control module is configured to program the corresponding PCM switch by providing:
a first control pulse to a corresponding driver when the corresponding PCM switch is to be programmed in an ON state in correspondence of the first electrical pulse profile, and
a second control pulse to the corresponding driver when the corresponding PCM switch is to be programmed in an OFF state in correspondence of the second electrical pulse profile.

13. A method of programming a state of a phase change material (PCM) switch, the PCM switch comprising a heater and a volume of a PCM, the method comprising:
providing a driver circuit;
integrating the driver and the PCM switch on the same chip;
applying a first control pulse to the driver circuit when the PCM switch is to be programmed in an ON state;
applying a second control pulse to the driver when the PCM switch is to be programmed on an OFF state;
through the driver circuit, applying a first driver pulse, in correspondence with the first control pulse, to the PCM switch;
through the driver circuit, applying a second driver pulse, in correspondence with the second control pulse, to the PCM switch, and
wherein:
an amplitude of second control pulse is greater than an amplitude of the first control pulse, and
a width of the second control pulse is shorter than a width of the first control pulse.

14. The method of claim 13, wherein the widths of the first and the second control pulses are programmable.

15. The method of claim 14, further comprising controlling the amplitudes of the first and the second control pulses through a feedback mechanism.

* * * * *